(12) United States Patent
Aga et al.

(10) Patent No.: US 9,793,154 B2
(45) Date of Patent: Oct. 17, 2017

(54) METHOD FOR MANUFACTURING BONDED SOI WAFER

(71) Applicant: SHIN-ETSU HANDOTAI CO., LTD., Tokyo (JP)

(72) Inventors: Hiroji Aga, Takasaki (JP); Norihiro Kobayashi, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/120,848

(22) PCT Filed: Feb. 9, 2015

(86) PCT No.: PCT/JP2015/000575
§ 371 (c)(1),
(2) Date: Aug. 23, 2016

(87) PCT Pub. No.: WO2015/136834
PCT Pub. Date: Sep. 17, 2015

(65) Prior Publication Data
US 2016/0372363 A1    Dec. 22, 2016

(30) Foreign Application Priority Data
Mar. 10, 2014    (JP) ................................. 2014-046098

(51) Int. Cl.
*H01L 21/00*    (2006.01)
*H01L 21/762*    (2006.01)
(Continued)

(52) U.S. Cl.
CPC ...... *H01L 21/76254* (2013.01); *H01L 21/022* (2013.01); *H01L 21/02164* (2013.01); *H01L 21/324* (2013.01)

(58) Field of Classification Search
CPC ......... H01L 21/76254; H01L 21/26506; H01L 21/3226; H01L 21/76251; H01L 21/84; H01L 21/02658
See application file for complete search history.

(56) References Cited

U.S. PATENT DOCUMENTS

| | | |
|---|---|---|
| 5,374,564 A | 12/1994 | Bruel |
| 6,004,860 A | 12/1999 | Ogawa et al. |

(Continued)

FOREIGN PATENT DOCUMENTS

| | | |
|---|---|---|
| JP | H05-211128 A | 8/1993 |
| JP | H08-274285 A | 10/1996 |

(Continued)

OTHER PUBLICATIONS

May 19, 2015 International Search Report issued in International Patent Application No. PCT/JP2015/000575.

(Continued)

*Primary Examiner* — Zandra Smith
*Assistant Examiner* — John M Parker
(74) *Attorney, Agent, or Firm* — Oliff PLC

(57) ABSTRACT

The present invention is a method for manufacturing a bonded SOI wafer including: performing a thermal oxidation treatment including at least one of a thermal oxidation during temperature-rising and a thermal oxidation during temperature-falling with the use of a batch type heat treatment furnace, thereby forming a silicon oxide film in such a way that the oxide film buried in the delaminated bonded SOI wafer has a concentric oxide film thickness distribution, and subjecting the bonded SOI wafer after delaminating a bond wafer to a reducing heat treatment to make a film thickness range of the buried oxide film being smaller than a film thickness range before the reducing heat treatment. This provides a method for manufacturing a bonded SOI (Continued)

wafer which can suppress a variation of a radial distribution of a buried oxide film thickness caused by a reducing heat treatment performed after delaminating the SOI layer.

8 Claims, 3 Drawing Sheets

(51) Int. Cl.
  *H01L 21/02* (2006.01)
  *H01L 21/324* (2006.01)

(56) References Cited

U.S. PATENT DOCUMENTS

| | | | |
|---|---|---|---|
| 6,294,478 B1 | 9/2001 | Sakaguchi et al. | |
| 6,362,076 B1 | 3/2002 | Inazuki et al. | |
| 6,372,609 B1* | 4/2002 | Aga | H01L 21/76254 257/E21.568 |
| 7,759,254 B2* | 7/2010 | Sasaki | H01L 21/02052 438/480 |
| 2003/0181001 A1 | 9/2003 | Aga et al. | |
| 2007/0069335 A1 | 3/2007 | Endo et al. | |
| 2007/0161199 A1* | 7/2007 | Morita | H01L 21/76256 438/311 |
| 2008/0128851 A1 | 6/2008 | Aga et al. | |
| 2008/0261376 A1* | 10/2008 | Yamazaki | H01L 21/2007 438/406 |
| 2009/0023269 A1* | 1/2009 | Morimoto | H01L 21/324 438/458 |
| 2010/0120223 A1* | 5/2010 | Kobayashi | H01L 21/02057 438/458 |
| 2011/0223740 A1 | 9/2011 | Ishizuka et al. | |
| 2012/0009797 A1* | 1/2012 | Reynaud | H01L 21/76254 438/756 |
| 2014/0329372 A1* | 11/2014 | Aga | H01L 21/26506 438/458 |

FOREIGN PATENT DOCUMENTS

| | | |
|---|---|---|
| JP | H09-237884 A | 9/1997 |
| JP | H11-307472 A | 11/1999 |
| JP | 2000-124092 A | 4/2000 |
| JP | 2010-141127 A | 6/2010 |
| JP | 2010-153488 A | 7/2010 |
| JP | 2013-125909 A | 6/2013 |
| WO | 03-009386 A1 | 1/2003 |
| WO | 2005/027204 A1 | 3/2005 |
| WO | 2013/088636 A1 | 6/2013 |

OTHER PUBLICATIONS

August 2, 2017 Search Report issued in Singapore Application No. 11201606965Q.

* cited by examiner

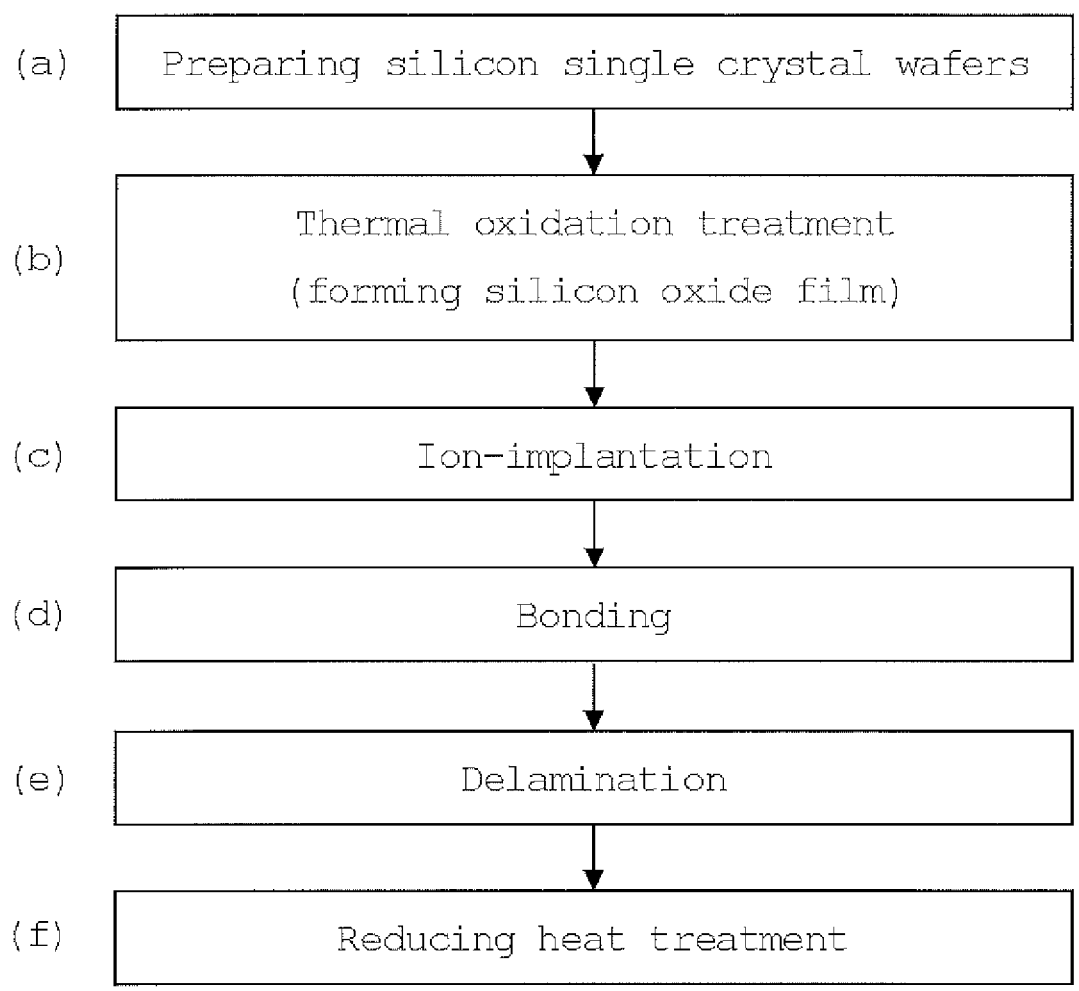

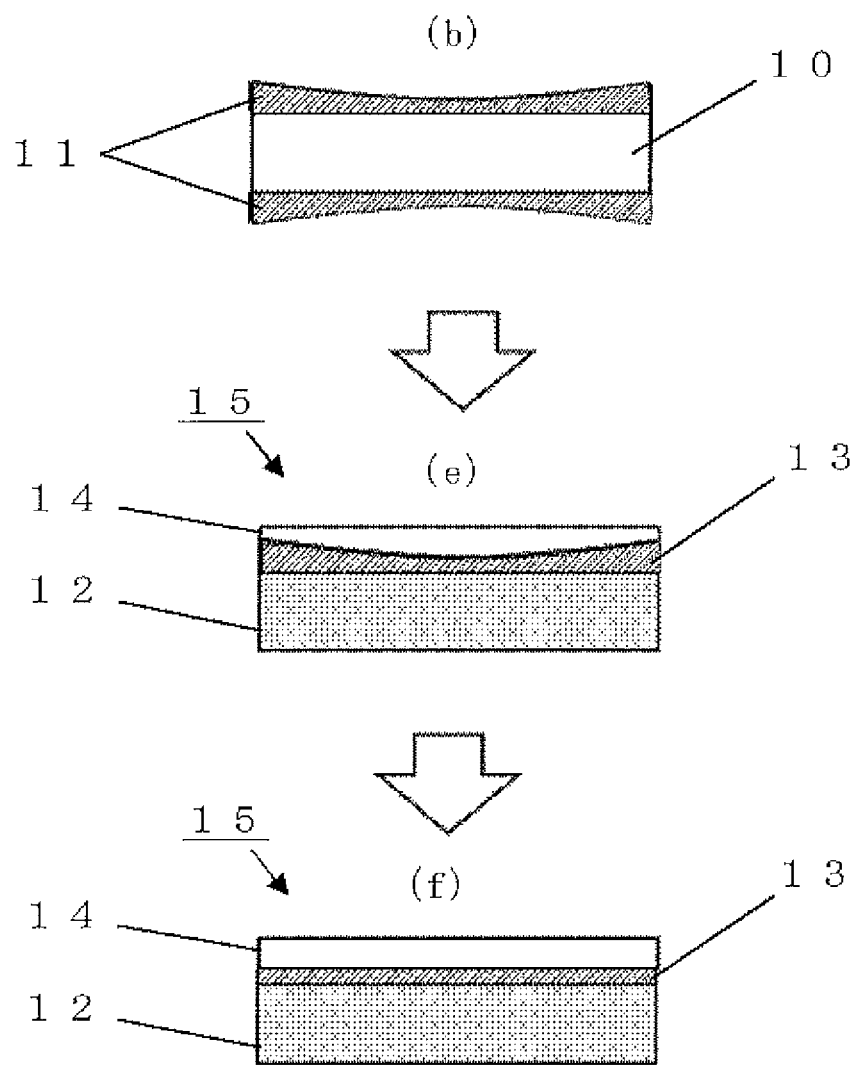

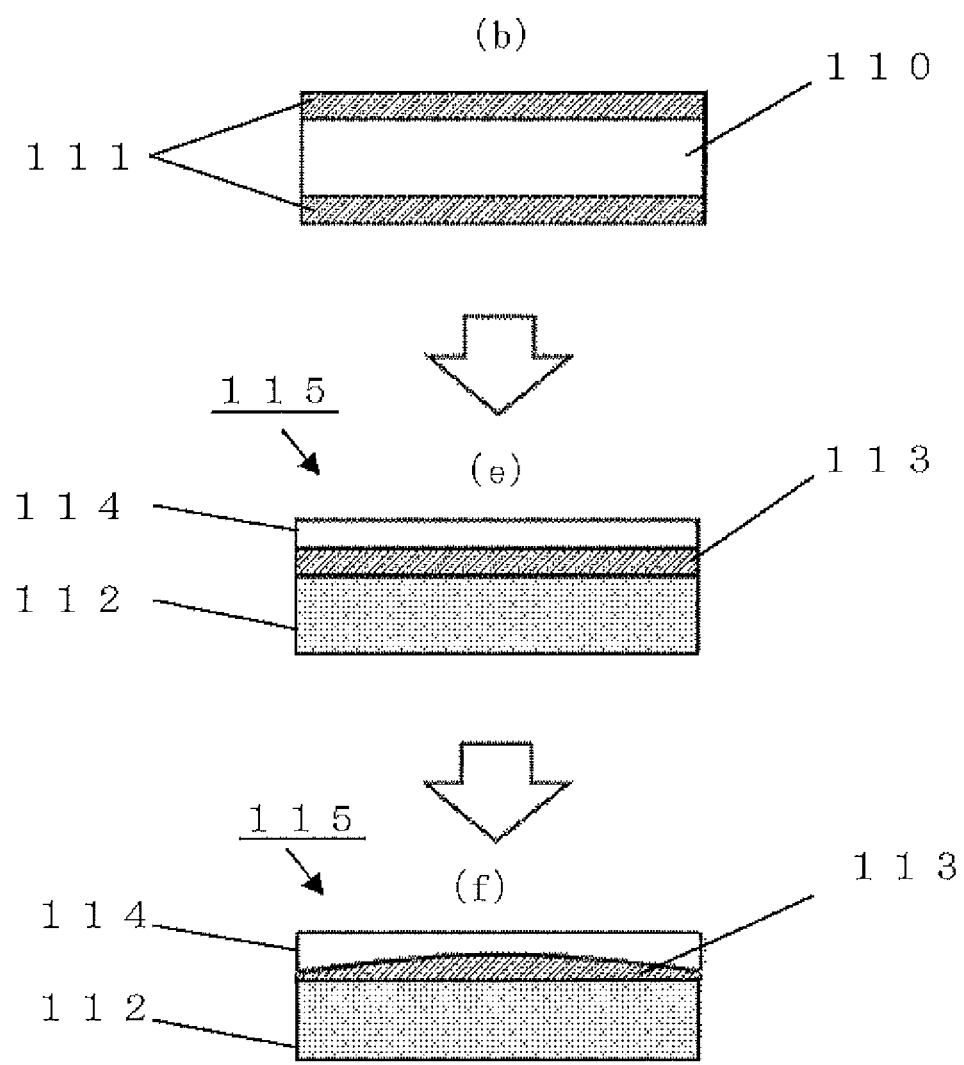

METHOD FOR MANUFACTURING BONDED SOI WAFER

TECHNICAL FIELD

The present invention relates to a method for manufacturing a bonded SOI wafer using an ion-implantation delamination method.

BACKGROUND ART

In recent years, as a method for manufacturing an SOI wafer, a method for delaminating an ion-implanted wafer after bonding to manufacture an SOI wafer (an ion-implantation delamination method: technology that is also called a smart cut method (a registered trademark)) has newly started to attract attention. In this ion-implantation delamination method, an oxide film is formed on at least one of two silicon wafers, and from an upper surface of one silicon wafer (a bond wafer), gas ions such as hydrogen ions or rare gas ions are implanted to form a micro bubble layer (an enclosed layer) in the wafer.

Then, the ion-implanted surface is adhered closely to the other silicon wafer (a base wafer) through the oxide film, followed by subjecting to a heat treatment (a delamination heat treatment) to delaminate one wafer (the bond wafer) in a thin film shape by using the micro bubble layer to be a cleavage surface, and additionally subjected to a heat treatment (a bonding heat treatment) to strengthen the bonding. This is such a technology to make an SOI wafer (see Patent Document 1).

This method makes the cleavage surface (delaminated surface) to be an excellent mirror surface, and relatively easily gives an SOI wafer with the SOI layer having highly uniform film thickness.

In case of manufacturing the SOI wafer by the ion-implantation delamination method, however, the SOI wafer surface after delamination has a damaged layer caused by the ion-implantation, and has a larger surface roughness compared to a mirror surface of a silicon wafer on a normal product level. Therefore, in the ion-implantation delamination method, it becomes necessary to remove such damaged layer and surface roughness. Previously, to remove this damaged layer or the like, mirror polishing with a very small polishing stock removal (a stock removal: approximately 100 nm), which is called touch polishing, has been carried out at a final step after the bonding heat treatment.

When the SOI layer is subjected to polishing including a machining element, however, since the polishing stock removal is not uniform, there arises a problem of deteriorating film thickness uniformity of the SOI layer achieved by implantation of hydrogen ions or the like and delamination.

As a method for solving such a problem, flattening treatment that improves surface roughness by performing high temperature heat treatment has been conducted in place of the aforementioned touch polishing.

For example, Patent Document 2 describes an application of a heat treatment (a rapid heating/rapid cooling heat treatment (RTA: Rapid Thermal Annealing)) in a reducing atmosphere containing hydrogen without polishing a surface of an SOI layer after a delamination heat treatment or a bonding heat treatment.

Further, Patent Document 3 describes forming an oxide film on an SOI layer by a heat treatment in an oxidizing atmosphere after a delamination heat treatment (or after a bonding heat treatment), then removing the oxide film, and subsequently applying a heat treatment (the rapid heating/rapid cooling heat treatment (RTA treatment)) in a reducing atmosphere.

Furthermore, in Patent Document 4, an SOI wafer after delamination is subjected to a sacrificial oxidation treatment subsequent to a flattening heat treatment in an atmosphere of inert gas, hydrogen gas, or a mixed gas thereof to achieve both flattening of a delaminated surface and avoidance of OSF.

As described above, flattening treatment that improves surface roughness by performing high temperature heat treatment has been conducted in place of the aforementioned touch polishing. As a result, the ion-implantation delamination method can now give an SOI wafer having a diameter of 300 mm with excellent film thickness uniformity in a mass-production level, in which the film thickness range (a value subtracted the minimum from the maximum in the plain) of the SOI layer is 3 nm or less.

With recent spread of portable terminals, reduction in power consumption, miniaturization, and high functionality of semiconductor devices are required, and a fully depleted device using an SOI wafer has been developed as a strong candidate in 22 nm and subsequent generations based on design rules. In this fully depleted device, the film thickness of an SOI layer is very thin such as 10 nm or so, and a film thickness distribution of an SOI layer affects a threshold voltage of the device, and accordingly, the radial film thickness distribution of the SOI layer is required to have uniformity in which the radial film thickness range is about 1 nm or less.

Moreover, in recent years, it has been proposed to control a threshold voltage of a device by applying a bias to a buried oxide film layer (hereinafter, also referred to as a BOX film) that is usually used for insulation from a base wafer. In this case, it is necessary to produce a Thin BOX type SOI wafer, in which the BOX film thickness is decreased, and the radial distribution of the BOX film thickness have to be highly uniform (specifically, the film thickness range is 1 nm or less).

In a method to produce such a thin film SOI wafer of a Thin BOX type, regarding the uniformity of a film thickness distribution of the SOI layer, the film thickness range of 1 nm or less is achieved by performing a multistage ion-implantation method or a method to perform temperature-fall oxidation (a method in which an oxide film is grown during temperature-falling) in an oxidation treatment after delaminating the SOI layer to offset the film thickness distribution of the SOI layer due to implant depth and the radial stock removal due to oxidation in addition to the multistage ion-implantation (see Patent Document 5).

Moreover, Patent Document 6 describes a heat treatment at a temperature of 1000° C. or more in an atmosphere of hydrogen gas, argon gas, or a mixed gas thereof as a treatment to decrease the thickness of a buried oxide film of an SOI wafer.

CITATION LIST

Patent Literature

Patent Document 1: Japanese Unexamined Patent publication (Kokai) No. H05-211128
Patent Document 2: Japanese Unexamined Patent publication (Kokai) No. H11-307472
Patent Document 3: Japanese Unexamined Patent publication (Kokai) No. 2000-124092
Patent Document 4: WO 2003/009386

Patent Document 5: Japanese Unexamined Patent publication (Kokai) No. 2013-125909

Patent Document 6: Japanese Unexamined Patent publication (Kokai) No. 2010-141127

SUMMARY OF INVENTION

Problem to be Solved by the Invention

On the other hand, regarding the radial uniformity of a BOX film thickness, thin film SOI wafers of a Thin BOX type were produced on an experimental basis, and in-process transitions of radial film thickness ranges of SOI layers were investigated thereby. As a result, it has revealed that the radial distribution of BOX film thicknesses is worsened in a heat treatment in a reducing atmosphere of a flattening heat treatment performed after delaminating an SOI layer. The deterioration of a BOX film thickness distribution in a reducing atmosphere is caused by forming a radial film thickness distribution due to radial difference of reducing effects when the BOX film thickness is decreased by reduction of oxygen from $SiO_2$ in the BOX film.

As a factor to cause a radial distribution of BOX film thicknesses by such a reducing effect, it can be mentioned that concentric distribution tends to form in a vertical batch type heat treatment furnace, although it depends on an radial temperature distribution during temperature-rising and falling, and during high-temperature holding in a reducing heat treatment step, or a pressure distribution of oxygen out-diffused by reduction.

This is presumed to be caused by the following: in a batch type heat treatment furnace, the periphery of a wafer is close to the heater, which is a heat source, thereby being apt to generate temperature difference between the central portion and the periphery of the wafer; and process gas flows between the boat and the tube, thereby being apt to generate partial pressure of oxygen between the central portion and the periphery of the wafer. Such a variation of BOX film thickness distribution due to a heat treatment in a reducing atmosphere (reducing heat treatment) can be a big issue particularly in a thin film SOI wafer of a Thin BOX type, which needs to have higher uniformity, although the distribution is caused regardless of the thickness of a BOX film.

The present invention was accomplished in view of the above-described problems. It is an object of the present invention to provide a method for manufacturing a bonded SOI wafer which can suppress a variation of radial thickness distribution of a buried oxide film caused by a reducing heat treatment performed after delaminating an SOI layer.

Solution to Problem

To achieve the foregoing object, the present invention provides a method for manufacturing a bonded SOI wafer comprising: forming a silicon oxide film on a surface of at least one wafer of a bond wafer and a base wafer made of a silicon single crystal by a thermal oxidation treatment, implanting at least one gas ion of a hydrogen ion and a rare gas ion into the bond wafer from a surface thereof to form an ion-implanted layer, bonding the ion-implanted surface of the bond wafer to a surface of the base wafer through the silicon oxide film, and delaminating the bond wafer at the ion-implanted layer; wherein the thermal oxidation treatment includes at least one of a thermal oxidation during temperature-rising and a thermal oxidation during temperature-falling, and is performed by using a batch type heat treatment furnace, thereby forming the silicon oxide film in such a way that the oxide film buried in the delaminated bonded SOI wafer has a concentric oxide film thickness distribution, and the bonded SOI wafer after delaminating the bond wafer is subjected to a reducing heat treatment to make a film thickness range of the buried oxide film being smaller than a film thickness range before the reducing heat treatment.

In a reducing heat treatment of a bonded SOI wafer after delaminating a bond wafer, the buried oxide film thicknesses tends to have a concentric radial distribution. Accordingly, on forming the silicon oxide film, by forming a radial distribution to cancel the foregoing radial distribution of the buried oxide film thickness caused by the reducing heat treatment, it is possible to securely obtain a bonded SOI wafer with good uniformity.

In this case, the film thickness range of the buried oxide film after the reducing heat treatment can be 1.0 nm or less.

The inventive method can surely give an SOI wafer having such an excellent film thickness range.

In this case, the reducing heat treatment can be performed in an atmosphere of 100% argon gas, an atmosphere of 100% hydrogen gas, or an atmosphere of a mixed gas thereof.

In the inventive method, it is suitable to perform a reducing heat treatment in the foregoing gas atmosphere.

In this case, the concentric oxide film thickness distribution can be formed into a concave distribution.

In a reducing heat treatment of a bonded SOI wafer after delaminating a bond wafer, the film thickness distribution of the buried oxide film tends to be a concentric convex shape. Accordingly, by making the film thickness distribution of the buried oxide film into a concave shape in advance, the variation of the film thickness distribution can be canceled, and a bonded SOI wafer having a buried oxide film with good uniformity can be obtained more securely.

Advantageous Effects of Invention

The inventive method for manufacturing an SOI wafer can suppress variation of a radial distribution of a buried oxide film thickness caused by a reducing heat treatment performed after delaminating an SOI layer.

BRIEF DESCRIPTION OF DRAWINGS

FIG. 1 illustrates a process flowchart of a method for manufacturing a bonded SOI wafer of the present invention;

FIG. 2 illustrates a process flowchart of a method for manufacturing a bonded SOI wafer of the present invention in case of forming a silicon oxide film so as to form a concave distribution of the BOX film thicknesses (Example);

FIG. 3 illustrates a schematic diagram of a process flow of a method for manufacturing a bonded SOI wafer in Comparative Example.

DESCRIPTION OF EMBODIMENTS

As described above, there has been a problem of deteriorating a radial film thickness distribution of a buried oxide film (BOX film) by a reducing heat treatment after delaminating a bond wafer.

Accordingly, the present inventors diligently investigated. And the present inventors conceived that a bonded SOI wafer having a buried oxide film with high uniformity can be securely obtained by forming a radial distribution to cancel the radial distribution of a buried oxide film which is caused by the reducing heat treatment, in case of forming the silicon oxide film.

The inventors further conceived that the deterioration of a radial distribution caused by a reducing heat treatment can be cancelled by performing a thermal oxidation treatment which includes at least one of a thermal oxidation during temperature-rising and a thermal oxidation during temperature-falling in a batch type heat treatment furnace when forming a silicon oxide film; thereby brought the present invention to completion.

In the following, the present invention will be explained specifically.

The inventive method for manufacturing an SOI wafer uses an ion-implantation delamination method. FIG. 1 illustrates a process flowchart of the inventive method for manufacturing a bonded SOI wafer by using an ion-implantation delamination method.

First, in step (a) of FIG. 1, a silicon single crystal wafers which are mirror polished, for example, are prepared as a bond wafer and a base wafer to be a support substrate.

Then, in step (b) of FIG. 1, a silicon oxide film is formed on the bond wafer by a thermal oxidation treatment by using a batch type heat treatment furnace. This silicon oxide film may be formed onto only the base wafer and may be formed onto the both wafers.

In this thermal oxidation treatment step to form a silicon oxide film of the present invention, the silicon oxide film in such a way that a buried oxide film of the delaminated bonded SOI wafer has a concentric oxide film thickness distribution is formed by performing the thermal oxidation treatment which includes at least one of a thermal oxidation during temperature-rising and a thermal oxidation during temperature-falling.

In a batch type heat treatment furnace, an oxide film thickness distribution in a convex shape tends to form in the surface by performing a thermal oxidation treatment during temperature-falling. This is because the periphery of a silicon single crystal wafer tends to radiate heat during temperature-falling of a batch type heat treatment furnace, thereby being relatively low temperature compared to the central portion. Accordingly, it is possible to make the radial distribution of a silicon oxide film (BOX film after delamination) to be a concentric convex shape by an oxidation treatment during temperature-falling.

Furthermore, regarding the size of a convex shape formed by temperature-fall oxidation, the difference between the film thicknesses at the central portion and at the periphery gets larger when the temperature of the temperature-fall oxidation is higher, the difference between the initial temperature and the temperature till the end of the oxidation is larger, the temperature gradient is larger, and the size of a gap (slot interval) with respect to a wafer on an upper surface in a batch is narrower. Accordingly, by selecting these parameters appropriately, it is possible to obtain a convex oxide film with a desired radial distribution. In this case, oxidation during isothermal holding may be combined in accordance with a need.

On the other hand, by performing an oxidation treatment during temperature-rising, it is possible to form an oxide film thickness distribution with a concentric concave shape in the surface. Since in temperature-rising, the temperature is begun to raise from the periphery of a wafer. In this case, it is also possible to obtain a concave oxide film with a desired radial distribution by appropriately selecting parameters such as the temperature of the temperature-rise oxidation, the temperature difference, the temperature gradient, the interval between the slots, and so on as described above. In this case, oxidation during isothermal holding may also be combined in accordance with a need.

As described above, the concentric convex distribution of the oxide film thicknesses can be formed by performing only temperature-fall oxidation without performing temperature-rise oxidation, or by performing temperature-fall oxidation and oxidation during isothermal holding as needed; and the concentric concave distribution of the oxide film thicknesses can be formed by performing only temperature-rise oxidation without performing temperature-fall oxidation, or by performing temperature-rise oxidation and oxidation during isothermal holding as needed. Alternatively, by combining the temperature-rise oxidation and temperature-fall oxidation appropriately, it is possible to form an oxide film with a desired concentric oxide film thickness distribution with high accuracy.

Then, in step (c) of FIG. 1, an ion-implanted layer is formed into a bond wafer by implanting a gas ion such as a hydrogen ion, a rare gas ion, etc.

Subsequently, in step (d) of FIG. 1, the ion-implanted surface of the bond wafer and a surface of the base wafer are adhered closely with the silicon oxide film interposed therebetween, and are bonded.

It is to be noted that the both wafers may be washed before bonded to each other in order to remove a particle and an organic substance adhered on the surface of a wafer before bonding.

Then, in step (e) of FIG. 1, the bond wafer is delaminated at the ion-implanted layer as a boundary to form a buried silicon oxide film and an SOI layer on the base wafer, thereby, obtaining a bonded SOI wafer.

It is also possible to perform a sacrificial oxidation treatment (after a thermal oxidation, a formed thermal oxide film is removed) and so on after the delaminating step (e) to remove a damaged layer of the ion-implanted layer, although which is not described in FIG. 1.

Subsequently, in step (f) of FIG. 1, a heat treatment is performed in a reducing atmosphere (reducing heat treatment). It is to be noted that the reducing atmosphere in the present invention means an atmosphere to generate a phenomenon in which oxygen is reduced from $SiO_2$ in the BOX by the heat treatment to decrease the BOX film thickness. Specifically, suitable examples thereof include an atmosphere of 100% argon gas, an atmosphere of 100% hydrogen gas, and an atmosphere of a mixed gas thereof, but is not limited thereto.

In manufacturing an SOI wafer by an ion-implantation delamination method, the stock removal of the BOX film at the periphery of a wafer tends to large when the delaminated bonded SOI wafer is subjected to a reducing heat treatment in order to flatten the delaminated surface or to remove the damage, and accordingly a BOX film thickness distribution after the reducing heat treatment generally tends to be a concentric convex shape. Naturally, it can be also a concentric concave shape depending on the heat treatment condition.

Therefore, the BOX film thickness distribution after the reducing heat treatment can be uniformed by combining the temperature-rise oxidation and temperature-fall oxidation appropriately as a heat treatment condition in the BOX oxidation (thermal oxidation treatment step (b)) in accordance with the BOX film thickness distribution after the reducing heat treatment or the distribution of a stock removal of the BOX film thickness by the reducing heat treatment as in the present invention.

As described above, a BOX film thickness distribution after a reducing heat treatment is generally apt to be a concentric convex shape. Accordingly, the concentric oxide film thickness distribution of a silicon oxide film formed before bonding is preferably formed into a concave distribution.

By the foregoing, a bonded SOI wafer having a BOX film with high uniformity can be easily obtained.

FIG. 2 shows the inventive manufacturing method when forming a silicon oxide film in such a way that the BOX film thickness distribution after a delamination step (e) becomes concave shape in a thermal oxidation step (b) before bonding.

In this case, a silicon oxide film 11 having a film thickness distribution with a concentric concave shape is formed on a bond wafer 10 made of a silicon single crystal as shown in (b) of FIG. 2.

When a concave thickness distribution of a silicon oxide film is formed in the thermal oxidation step (b) as described above, it is possible to obtain a bonded SOI wafer 15 having a buried oxide film (BOX film) 13 with a concentric concave shape between a base wafer 12 and an SOI layer 14 after a delamination step (e) as shown in (e) of FIG. 2.

By applying a reducing heat treatment step (f) to the bonded SOI wafer 15 obtained in (e) of FIG. 2, the convex thickness distribution of the BOX film that is supposed to be formed by this reducing heat treatment is cancelled by the preformed concave thickness distribution of the BOX film, and accordingly, it is possible to suppress the deterioration of uniformity caused by a reducing heat treatment. As a result, a bonded SOI wafer having a BOX film with high uniformity can be obtained as shown in (f) of FIG. 2.

FIG. 2 was explained with assuming that the BOX film thickness distribution caused by the reducing heat treatment is a convex shape. In case of a concave thickness distribution of the BOX film is caused by the reducing heat treatment, the silicon oxide film 11 may be formed so as to form a convex thickness distribution of the delaminated BOX film in the thermal oxidation treatment step (b).

In the present invention, the film thickness range of the buried oxide film (BOX film) after the reducing heat treatment can be 1.0 nm or less.

By such a manufacturing method, it is possible to obtain a bonded SOI wafer with higher uniformity fully satisfying a BOX film thickness range of 1 nm or less, which is recently required to a thin film SOI wafer of a Thin BOX type, furthermore, satisfying 0.5 nm or less.

Example

The present invention will be more specifically described below with reference to Example and Comparative Example, but the present invention is not limited thereto.

Example

Only to a bond wafer with a diameter of 300 mm made of silicon single crystal, a silicon oxide film (the silicon oxide film to be a BOX film after delamination) was prepared with a thickness of 30 nm ((b) of FIG. 1), and then hydrogen ion-implantation was performed ((c) of FIG. 1).

A silicon oxide film was formed by using a batch type heat treatment furnace, and introducing oxygen gas during temperature-rising of 900° C. to 950° C. and during isothermal-holding at 950° C., thereby performing temperature-rise oxidation of dry oxidation. In order to enhance the effect of the temperature-rise oxidation, the temperature-rise rate during the temperature-rising of 900° C. to 950° C. was set to 1° C./min. (It is to be noted that the wafer was put to the oxidation furnace at a temperature of 600° C., and the temperature-rise rate from 600° C. to 900° C. was set to 5° C./min).

The radial range in the radial distribution of the silicon oxide film after the temperature-rise oxidation was 0.8 nm, and the distribution was a concentric concave shape, in which the periphery was thicker than the central portion as in (b) of FIG. 2.

The hydrogen ion-implantation was divisionally carried out in two steps, and the first implantation was performed with $H^+$, 30 keV, 2.6 e16 $cm^{-2}$, the implantation angle of 0°, the notch orientation angle of 0°, and the second implantation was performed with $H^+$, 30 keV, 2.6 e16 $cm^{-2}$, the implantation angle of 0°, the notch orientation angle of 90°.

After the hydrogen ion-implantation, the bond wafer was bonded to a base wafer ((d) of FIG. 1), and delaminated at the hydrogen ion-implanted layer by a heat treatment in a nitrogen atmosphere at 500° C. for 30 minutes ((e) of FIG. 1). The film thickness of the SOI layer immediately after the delamination was 330 nm.

Subsequently, a thermal oxide film (sacrificial oxidation film) of 250 nm was formed on the delaminated surface by performing a pyrogenic oxidation treatment at 900° C., and then the formed oxide film was removed by 10% aqueous HF solution to remove a damaged layer of the ion-implantation.

Then, a reducing heat treatment was performed at 1200° C. for 1 hour in an atmosphere of 100% Ar to flatten the surface ((f) in FIG. 1).

After the reducing heat treatment, the BOX film thickness was thinned to 25 nm, the film thickness range in the radial distribution of the BOX film thickness was 0.4 nm, which was improved compared to the range before the reducing heat treatment, and a bonded SOI wafer having a BOX film with high uniformity as in (f) of FIG. 2 was obtained.

Subsequently, a thermal oxide film (sacrificial oxidation film) of 400 nm was formed by performing a pyrogenic oxidation treatment at 950° C., and then the formed thermal oxide film was removed by 10% aqueous HF solution to prepare an SOI layer of 10 nm (±0.5 nm). The BOX film thickness after removing the sacrificial oxidation film (after the thinning) had high uniformity likewise after the reducing heat treatment, which revealed that the bonded SOI wafer had excellent BOX film uniformity.

Comparative Example

A bonded SOI wafer was prepared as in the same manner with Example except that the oxidation of a bond wafer was carried out at a constant temperature of 950° C. as conventionally.

In this case, the radial distribution of the silicon oxide film 111 on the surface of the bond wafer 110 had a uniform distribution as shown in (b) of FIG. 3. The radial range in the radial distribution of the silicon oxide film 111 was 0.2 nm. (It is to be noted that the wafer was put to the oxidation furnace at a temperature of 600° C., the temperature-rise rate from 600° C. to 950° C. was set to 5° C./min, and after reached to 950° C., dry oxidation was carried out at a constant temperature with introducing oxygen gas).

Subsequently, the delamination by heat treatment was carried out as in the same manner with Example to prepare an SOI wafer 115. At this point, the radial distribution of the BOX film 113 between the base wafer 112 and the SOI layer 114 was uniform as shown in (e) of FIG. 3.

Then, a reducing heat treatment was performed as in the same manner with Example. As a result, the film thickness range in the radial film thickness distribution of the BOX film 113 was 1.1 nm, which got worse than that before the reducing heat treatment, and had radial distribution of concentric convex shape as in (f) of FIG. 3.

Subsequently, a thermal oxide film (sacrificial oxidation film) of 400 nm was formed by performing a pyrogenic oxidation treatment at 950° C., and then the formed thermal oxide film was removed by 10% aqueous HF solution to prepare an SOI layer of 10 nm (±0.5 nm).

The film thickness range of the BOX film at this point also exceeded 1 nm.

The conditions for forming the silicon oxide films, the conditions of ion-implantation delamination, the conditions of the reducing thermal oxidation treatment, the conditions of the sacrificial oxidation treatment, and the results of the foregoing Example and Comparative Example are shown in Table 1.

TABLE 1

|  | Example | Comparative Example |
|---|---|---|
| Bond wafer | Diameter: 300 mmφ, <100>, Surface oxide film: 30 nm, with temperature-rise oxidation, Oxidation temperature: 900 to 950° C. + 950° C. holding, Temperature-rise rate: 1° C./min, Oxide film thickness range: Distribution: concentric concave distribution | Diameter: 300 mmφ, <100>, Surface oxide film: 30 nm, without temperature-rise oxidation, Oxidation Temperature: 950° C. holding, Oxide film thickness range: 0.2 nm, Distribution: uniform 0.8 nm, |
| Base wafer | Diameter: 300 mm, <100>, without surface oxide film | |
| Divided implantation | Divided into two processes | Divided into two processes |
| Condition of first implantation | H+, 30 keV, 2.6e16 cm−2, Implantation angle: 0°, Notch orientation angle: 0° | H+, 30 keV, 2.6e16 cm−2, Implantation angle: 0°, Notch orientation angle: 0° |
| Condition of second implantation | H+, 30 keV, 2.6e16 cm−2, Implantation angle: 0°, Notch orientation angle: 90° | H+, 30 keV, 2.6e16 cm−2, Implantation angle: 0°, Notch orientation angle: 90° |
| Delamination heat treatment | 500° C., 30 min, nitrogen atmosphere | |
| SOI film thickness immediately after delamination | 330 nm | 330 nm |
| Sacrificial oxidation (thermal oxidation + removal of oxide film) | 900° C., Pyrogenic oxidation, Thickness of thermal oxide film: 250 nm, Removed by 10% aq. HF soln. | 900° C., Pyrogenic oxidation, Thickness of thermal oxide film: 250 nm, Removed by 10% aq. HF soln. |
| BOX film thickness before reducing heat treatment | 31 nm Radial range: 0.8 nm | 31 nm Radial range: 0.2 nm |
| Reducing heat treatment | Ar, 1200° C., 1 hour | Ar, 1200° C., 1 hour |
| Sacrificial oxidation (thermal oxidation + removal of oxide film) | 950° C., Pyrogenic oxidation, Thickness of thermal oxide film: 400 nm, Removed by 10% aq. HF soln. | 950° C., Pyrogenic oxidation, Thickness of thermal oxide film: 400 nm, Removed by 10% aq. HF soln. |
| SOI film thickness after thinning | 10 nm | 10 nm |
| BOX film thickness after thinning (after reducing heat treatment) | 25 nm Radial range: 0.4 nm Distribution: uniform | 25 nm Radial range: 1.1 nm Distribution: concentric convex distribution |

From Table 1, it was revealed that the film thickness range of the BOX film thickness distribution was less than 0.5 nm in Example, which gave a good radial distribution. On the other hand, the value was 1.1 nm in Comparative Example, which did not give a radial distribution to satisfy a recent requirement having a BOX film thickness range of 1 nm or less.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing a bonded SOI wafer comprising: forming a silicon oxide film on a surface of at least one wafer of a bond wafer and a base wafer made of a silicon single crystal by a thermal oxidation treatment, implanting at least one gas ion of a hydrogen ion and a rare gas ion into the bond wafer from a surface thereof to form an ion-implanted layer, bonding the ion-implanted surface of the bond wafer to a surface of the base wafer through the silicon oxide film, and delaminating the bond wafer at the ion-implanted layer; wherein
    the thermal oxidation treatment includes at least one of a thermal oxidation during temperature-rising and a thermal oxidation during temperature-falling, and is performed by using a batch type heat treatment furnace, thereby forming the silicon oxide film in such a way that the oxide film buried in the delaminated bonded SOI wafer has a concentric oxide film thickness distribution, and
    the bonded SOI wafer after delaminating the bond wafer is subjected to a reducing heat treatment to make a film thickness range of the buried oxide film being smaller than a film thickness range before the reducing heat treatment.

2. The method for manufacturing a bonded SOI wafer according to claim 1, wherein the film thickness range of the buried oxide film after the reducing heat treatment is 1.0 nm or less.

3. The method for manufacturing a bonded SOI wafer according to claim 2, wherein the reducing heat treatment is performed in an atmosphere of 100% argon gas, an atmosphere of 100% hydrogen gas, or an atmosphere of a mixed gas thereof.

4. The method for manufacturing a bonded SOI wafer according to claim 3, wherein the concentric oxide film thickness distribution is formed into a concave distribution.

5. The method for manufacturing a bonded SOI wafer according to claim 2, wherein the concentric oxide film thickness distribution is formed into a concave distribution.

6. The method for manufacturing a bonded SOI wafer according to claim 1, wherein the reducing heat treatment is performed in an atmosphere of 100% argon gas, an atmosphere of 100% hydrogen gas, or an atmosphere of a mixed gas thereof.

7. The method for manufacturing a bonded SOI wafer according to claim 6, wherein the concentric oxide film thickness distribution is formed into a concave distribution.

8. The method for manufacturing a bonded SOI wafer according to claim 1, wherein the concentric oxide film thickness distribution is formed into a concave distribution.

* * * * *